CONNECTOR WITH GLASS SUBSTRATE

Filed Aug. 8, 1963

INVENTOR.
HERBERT E. RUEHLEMANN
BY
Caesar and Rivise
ATTORNEYS.

CONNECTOR WITH GLASS SUBSTRATE

Filed Aug. 8, 1963 2 Sheets-Sheet 2

INVENTOR.
HERBERT E. RUEHLEMANN

BY

Caesar and Rivise

ATTORNEYS.

United States Patent Office 3,287,686
Patented Nov. 22, 1966

3,287,686
CONNECTOR WITH GLASS SUBSTRATE
Herbert E. Ruehlemann, Huntingdon Valley, Pa., assignor to Elco Corporation, Willow Grove, Pa., a corporation of Pennsylvania
Filed Aug. 8, 1963, Ser. No. 300,897
10 Claims. (Cl. 339—17)

This invention relates to a connector with glass substrate and is intended to provide a new and heretofore unknown device of this general class.

It is known to secure contacts to a printed circuit board by drilling or punching holes in the board, inserting the legs of the contact in the holes and then staking the contacts to the rear surface of the board. The foregoing assembly is exemplified by Fox Patent No. 2,994,056.

It is possible to achieve the foregoing structure because the printed circuit board is constructed of materials which may be drilled or punched. However, where the material involved is glass or ceramics, it is not feasible to drill or punch holes in the same and therefore printed circuit joining techniques are not readily applicable thereto.

Of particular interest in this connection is the so-called "glass substrate" which is now in wide use. Glass substrates may receive conductive material by means of vacuum deposit methods such that conductive layers are deposited in films of extremely small thickness to form resistors, diodes, capacitors, conductors, etc. In this manner ultra-miniaturization is achieved.

However, with the rise of the glass subtsrate it has become desirable to connect a considerable number of glass substrates to another element, such as a common board which is often designated as a mother board. The mother board is usually a multi-layer printed circuit board or a board permitting back-panel wiring by wire-wrapping techniques.

It is therefore a prime object of the present invention to provide a construction whereby a plurality of glass substrates will be surely and economically united electrically to a mother board.

Yet another object of the present invention is to avoid drilling and punching steps which are impractical upon glass and yet achieve electrical and mechanical connection between a glass substrate and a contact projecting therefrom.

Still another object of the present invention is to render a glass substrate substantially as versatile as a printed circuit board insofar as connection techniques are concerned.

The foregoing as well as other objects of the invention are achieved by providing a contact which is essentially two-headed and which includes a substrate head and a contact head joined by a body section. The contact head is preferably of a bifurcated construction and may be disposed in a plane at a 28° angle with respect to the substrate head. Also, the contact head may be vertically spaced with respect to the substrate head. Alternatively, the axis of the substrate head may be alined perpendicularly with respect to the axis of the contact head.

Another feature of the invention resides in the construction of the substrate head which basically includes a pair of widely spaced parallel fingers defining between them a gap for reception of the glass substrate. The fingers are provided on their inner surfaces with inwardly projecting bumps that actually make electrical and mechanical contacts with an inserted glass substrate. Further connection may be made by soldering and a final connection can be made using epoxy techniques.

Other objects and many of the attendant advantages of this invention will be readily appreciated as the same becomes better understood by reference to the following detailed description when considered in connection with the accompanying drawings wherein.

Figures 6, 7:
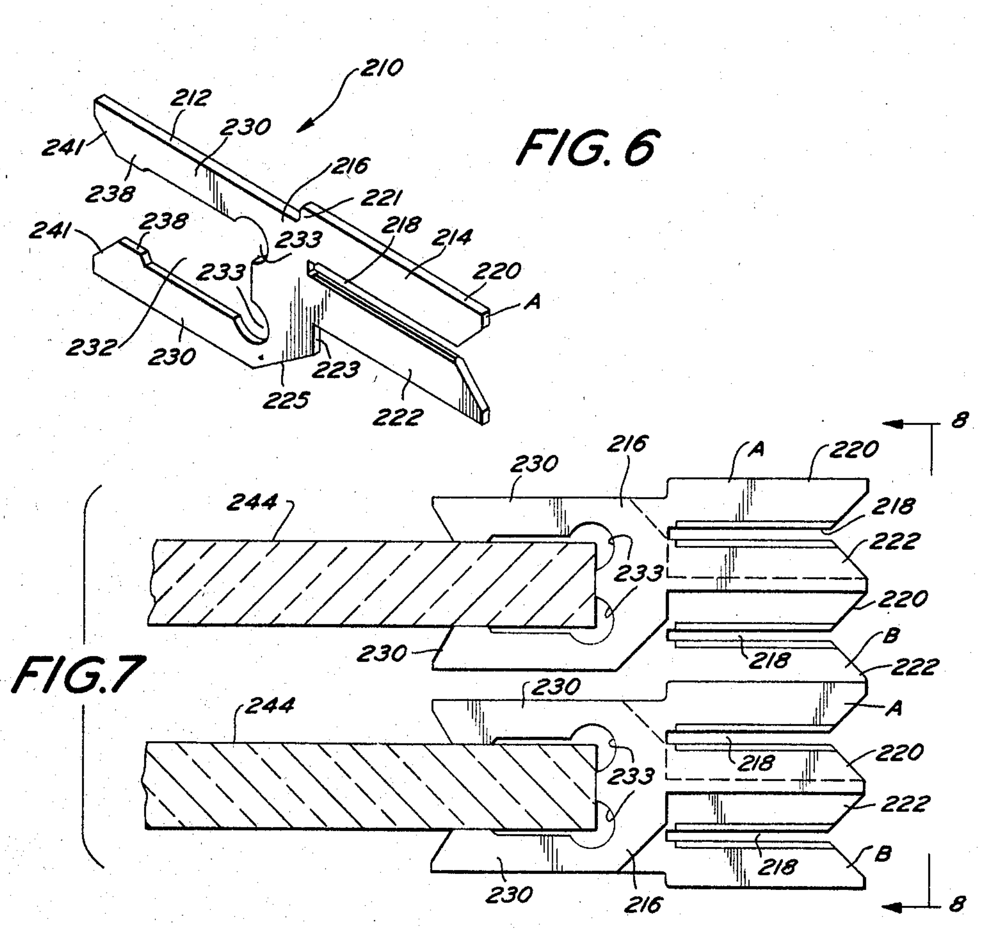
FIG. 6 is a perspective view of another embodiment of the present invention whereby the axis of the contact head is vertically spaced with respect to the axis of the substrate head.
Figure 8:
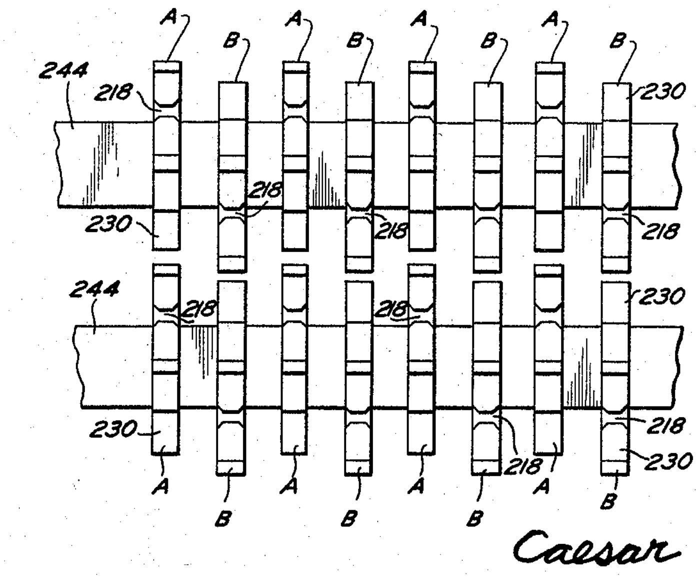

FIG. 7 is an enlarged sectional view showing contacts along the lines of FIG. 6, each secured to a glass substrate and wherein the axis of each contact head is slightly depressed or raised in alternating relationship with respect to the axis of the substrate heads which are all at the same level, there being shown two vertically aligned glass substrates; and FIG. 8 is a front elevational view taken along the lines 8—8 of FIG. 7.

Figure 2:
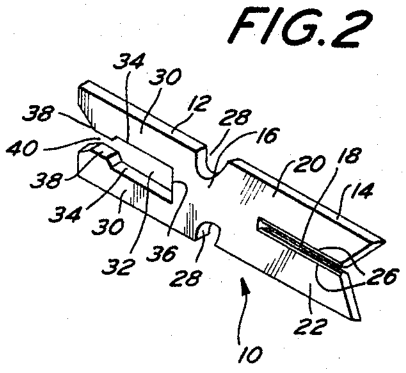
FIG. 2 is a perspective view of the contact utilized in FIG. 1.

Referring now to the various figures of the drawing wherein like reference numerals refer to like parts there is shown in FIG. 2 a contact 10 constituting a first embodiment of the present invention. The contact 10 is two-headed and basically includes a substrate head 12, and a contact head 14 disposed in a place at a 28° angle with respect to each other and joined by a body section 16.

The contact head 14 is bifurcated and is of a construction substantially the same as that disclosed in United States Patent No. 2,828,474. The entire contact 10 is generally flat and is constructed of a spring-hard Phosphor bronze, copper or other suitable electrically conductive material having the necessary balance of resiliency and strength required herein.

The contact head 14 is bifurcated by virtue of a slot 18 along the longitudinal center thereof to provide a pair of contact legs 20 and 22 which are spaced from each other by virtue of the slot 18. The outer edges of the contact legs 20 and 22 are generally parallel to each other with the front edges thereof then tapering backwardly towards each other until meeting the slot 18.

Figure 1:
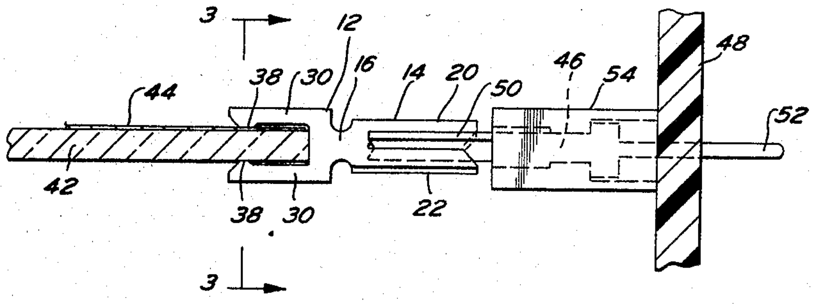
FIG. 1 is a perspective view with portions in section of an assembly including the contact of the present invention having a glass substrate secured in its substrate head and having a mother board contact mating with its contact head, the mother board contact being secured to a mother board and projecting through an insulator associated therewith.
Figure 3:
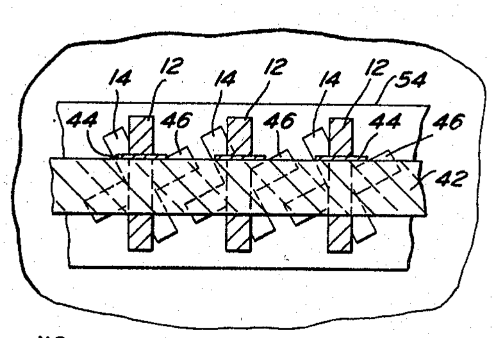
FIG. 3 is an enlarged sectional view taken along the line 3—3 of FIG. 1.

The inner edges 26 of the contact head 14 are chamfered to present substantially flat contact surfaces. In mating position, a contact with a contact head similarily constructed will mate perpendicularly with respect to the contact head 14 as illustrated in FIGS. 1 and 3 and as described in United States Patents No. 2,828,474 and No. 2,994,056. When this is done the chamfered surfaces of the contact heads are in engagement with each other to provide a large area of electrical contact. The distance between the inner edges of the contact legs 20 and 22 is slightly less than the thickness of the contact so that when a complementary contact is engaged in slot 18 the contact legs 20 and 22 are slightly forced apart to engage the mating contact under tension. Where desired such tension may be enhanced by the provision of an enlarged opening (not shown) at the rear end of the slot 18.

As the two cooperating contacts of bifurcated construction are brought into mating relationship the respective contact legs 20 and 22 are spread apart slightly to permit a smooth sliding action between the respective pairs of contact legs while still providing adequate tension to insure good electrical contact.

It is to be understood that other types of bifurcated mating sections may be employed and, also, the mating sections may be male, female or other types known in the art so long as satisfactory mating can occur at the contact head 14.

As previously stated the body section 16 bridges the substrate head 12 and the contact head 14. As shown in FIG. 2 the body section 16 includes a pair of notches 28 for insertion of the contact 10 in a holding member such as an insulating casing.

The substrate head 12 generally includes a pair of widely spaced parallel fingers 30, defining between them gap 32 for reception of a glass substrate. The outer edges of the fingers 30 are generally flat and terminate rearwardly at notches 28. The inner edges 34 of the fingers 30 are also generally flat and terminate rearwardly at the rear edge 36.

As the inner edges 34 move towards the front of the board head 12 they move sharply toward each other in bumps 38 to define a narrow gap 40 between them. The inner edges 34 then taper outwardly away from each other into squared off sections which eventually meet the outer edges of the board head 12. The narrowness of the gap 40 is important as the insertion of a glass substrate 42 therein causes the fingers 30 to be somewhat spread and this gives rise to a pressure contact between the fingers 30 through bumps 38 upon the conductive members 44 of the glass substrate 42.

As previously noted the contact head 14 mates with a similar contact head of a mother board contact 46 which has been electrically and mechanically secured to a mother board 48 having conductive members deposited thereon (not shown). The mother board contact 46 includes a mating head 50 which is constructed along the lines of contact head 14. The mother board contact 46 also includes a tail section 52 which projects beyond the mother board. As shown in FIG. 1 a considerable portion of the mother board contact 46 is located in an insulator 54 which is associated with the mother board.

The assembly of FIG. 1 can be repeated many times with a plurality of mother board contacts 46 projecting outwardly from the mother board 48 so that contact may be made between the mother board and many glass substrates similar to that of substrate 42 as shown in FIG. 1. In this connection the insulator 54 may be considerably elongated in a longitudinal direction as generally indicated in FIG. 3 which also reveals the 28° relationship between the place of the contact head 14 and plane substrate head 12.

Figures 4, 5:
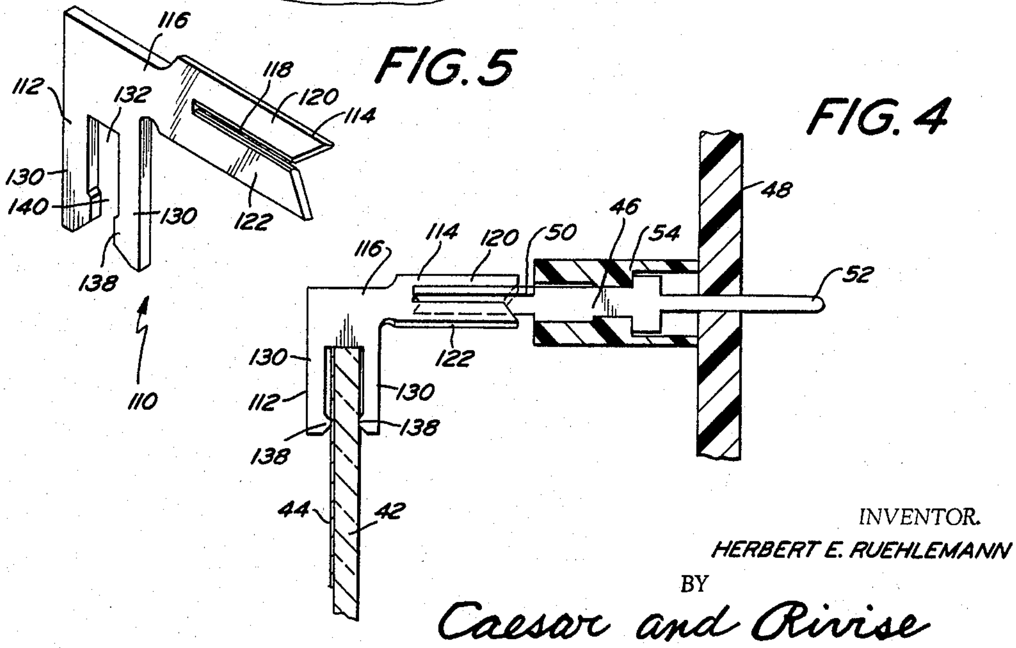
FIG. 4 is a view similar to FIG. 1 but employing a right angle contact of the present invention.
FIG. 5 is a perspective view of the right angle contact of FIG. 4.

FIGS. 4 and 5 show a right angle contact 110 constituting another embodiment of the present invention wherein reference characters similar to embodiment 10 be employed wherever possible with the addition of the number 1 in the hundred column in order to distinguish contact 110 from contact 10. Accordingly the contact of FIG. 5 includes a substrate head 112, a contact head 114 in the same plane as the substrate head 112 with the heads 112 and 114 being joined by a body section 116. As noted in FIG. 5 the rear section of the substrate head 112 is considerably enlarged in order to provide for the essential right angle departure of the contact head 114 so that the axis of the substrate head lies perpendicularly to the axis of the contact head. Aside from the foregoing the contact of the FIG. 5 contains many features in common with the contact of FIG. 2. The contact head 114 has a slot 118 defining contact legs 120 and 122. The substrate head 112 includes widely spaced fingers 130 defining a gap 132 and further possessing bumps 138 which define a narrow gap 140.

The use of the contact in FIG. 5 is shown in FIG. 4, and this use is essentially the same as that shown in FIG. 1 with the accompanying modified results provided by virtue of the right angle nature of the contact 110 such that the glass substrate 42 is disposed in a parallel relationship with the mother board 48.

Another embodiment of the present invention is shown in FIGS. 6 to 8 with contact 210 being shown separately in FIG. 6. The contact 210 basically includes a substrate head 212, a contact head 214 with a body section 216 joining the heads 212 and 214. The construction of the contact 210 is essentially the same as that of contact 14 but with the substrate head and contact head lying in the same plane. Thus, the contact 210 includes an elongated slot 218 defining spaced legs 220 and 222 which are constructed in accordance with the description of FIG. 2. As further shown in FIG. 6 the body section 216 is somewhat elongated in order that the glass substrate 244 may be received at a different level from that of the mother board contact which mates with the contact head 214. This can be appreciated from a study of FIG. 7. As further shown in FIGS. 7 and 8 the offsetting in a vertical direction of the substrate head 212 from the contact head 214 permits the provision of a set of vertically alternating contacts, one above the axis of the substrate head 212 and one below the axis of the substrate head 212. This is done in order to achieve mating with two rows of contacts secured to the mother board. In a two row connector assembly as illustrated in FIGS. 7 and 8 the aforesaid alternating pattern is quite effective with the upper contacts being labeled A and the lower contacts being labeled B.

As further noted in FIG. 6 the upper edge of contact leg 220 terminates in a step 221 which goes on to define the upper edge of a finger 230 of the substrate contact 212. The outer edge of the lower contact leg 222 terminates in a deep step 223 which merges into an inclined edge 225 that eventually becomes the outer edge of the lower finger 230 of the substrate head 212. Where contact head 214 is below substrate head 212 the positions of the steps 221 and 225 are reversed.

Another feature added to the contact of FIG. 6 is that a wider gap 232 than that of the contact of FIG. 2 is provided between the fingers 230. Furthermore this gap is in part defined by a pair of rear enlarged generally circular openings 233 in order to enhance the hinge-like action of the fingers 230 when they are spread during insertion of a glass substrate by virtue of the spreading action between the glass substrate and the bumps 238. As shown in FIG. 6, and as also shown in FIGS. 2 and 4 a pair of outwardly inclined edges 241 are provided in order to facilitate the entry of the glass substrate.

Yet another advantage of the construction of the present invention is that contact may be made with both sides of the glass substrate where both sides contain deposited circuitry. Even if the substrate has only the circuitry deposited on one side it is possible to produce a back-to-back positioning of two such glass substrates and thereby achieve contact with the printed members deposited on the outer surfaces of each of the glass substrates assembled in this manner.

Where desired permanent connection between the bumps 38, 138 or 238 and the conductive member of the glass substrate may be achieved through soldering and a final connection can be made using epoxy techniques.

Obviously many modifications and variations of the present invention are possible in the light of the above teachings. It is, therefore, to be understood that within the scope of the appended claims, the invention may be practiced otherwise than as specifically described.

What is claimed as the invention is:

1. In combination, a glass substrate and a contact secured thereto, said contact comprising a contact head and a substrate head integrally joined together by a body section, the contact head being bifurcated by virtue of a narrow slot, the substrate head being comprised of a pair of widely spaced parallel fingers defining between them a gap for reception of the glass substrate, said fingers being provided on their inner surfaces with at least one inwardly projecting bump to contact a glass substrate upon insertion thereof, said contact head being formed to mate with a contact having a similar contact head.

2. The invention of claim 1 including a pair of enlarged rear circular openings communicating with said gap.

3. The invention of claim 1 wherein the plane of said contact head is disposed at an acute angle with respect to the plane of said substrate head.

4. The invention of claim 1 wherein the longitudinal axis of said contact head is vertically spaced with respect to that of said substrate head.

5. The invention of claim 1 wherein the major axis of said contact head lies perpendicularly with respect to the major axis of said substrate head.

6. In combination, a plurality of glass substrates each having a plurality of contacts secured thereto, each of said contacts comprising a contact head and a substrate head integrally joined together by a body section, the longitudinal axis of said contact head being vertically spaced with respect to that of said substrate head, said substrate head being comprised of a pair of widely spaced parallel fingers defining between them a gap for reception of one of said pluralities of glass substrates, said fingers being provided on their inner surfaces with at least one inwardly projecting bump to contact a glass substrate upon insertion thereof, said contact head being adapted to be mated with a contact having a similar contact head, said contacts being spaced along said glass substrates, said contacts being mounted on said substrate so that the contact heads of adjacent contacts are oppositely spaced from said glass substrate.

7. A contact for use with a glass substrate comprising a contact head and a substrate head integrally joined together by a body section, the contact head being bifurcated by virtue of a narrow slot, the substrate head being comprised of a pair of widely spaced parallel fingers defining between them a gap for reception of the glass substrate, said contact including a pair of enlarged rear circular openings communicating with said gap, said fingers being provided on their inner surfaces with at least one inwardly projecting bump to contact a glass substrate upon insertion thereof, said contact head being formed to mate with a contact having a similar contact head.

8. A contact for use with a glass substrate comprising a contact head and a substrate head integrally joined together by a body section, the contact head being bifurcated by virtue of a narrow slot, the substrate head being comprised of a pair of widely spaced parallel fingers defining between them a gap for reception of the glass substrate, said fingers being provided on their inner surfaces with at least one inwardly projecting bump to contact a glass substrate upon insertion thereof, said contact head being formed to mate with a contact having a similar contact head, the plane of said contact head being disposed at an acute angle with respect to the plane of said substrate head.

9. A contact for use with a glass substrate comprising a contact head and a substrate head integrally joined together by a body section, the contact head being bifurcated by virtue of a narrow slot, the substrate head being comprised of a pair of widely spaced parallel fingers defining between them a gap for reception of the glass substrate, said fingers being provided on their inner surfaces with at least one inwardly projecting bump to contact a glass substrate upon insertion thereof, said contact head being formed to mate with a contact having a similar contact head, the longitudinal axis of said contact head being vertically spaced with respect to that of said substrate head.

10. A contact for use with a glass substrate comprising a contact head and a substrate head integrally joined together by a body section, the contact head being bifurcated by virtue of a narrow slot, the substrate head being comprised of a pair of widely spaced parallel fingers defining between them a gap for reception of the glass substrate, said fingers being provided on their inner surfaces with at least one inwardly projecting bump to contact a glass substrate upon insertion thereof, said contact head being formed to mate with a contact having a similar contact head, the major axis of said contact head lying perpendicularly with respect to the major axis of said substrate head.

References Cited by the Examiner

UNITED STATES PATENTS

| | | | |
|---|---|---|---|
| 2,248,718 | 7/1941 | Owen | 339—61 |
| 2,443,706 | 6/1948 | Jansen | 339—192 |
| 2,701,346 | 2/1955 | Powell | 339—17 |
| 2,828,474 | 3/1958 | Fox | 339—47 X |
| 2,832,942 | 4/1958 | French | 339—17 X |
| 2,869,107 | 1/1959 | Engel | 339—220 |
| 3,022,481 | 2/1962 | Stepoway | 339—75 |
| 3,061,911 | 11/1962 | Baker | 29—155.5 |
| 3,149,894 | 9/1964 | Fox | 339—17 |

EDWARD C. ALLEN, *Primary Examiner.*

ALFRED S. TRASK, *Examiner.*